(12) United States Patent
Bailey et al.

(10) Patent No.: US 6,594,893 B2
(45) Date of Patent: Jul. 22, 2003

(54) METHOD OF MAKING SURFACE LAMINAR CIRCUIT BOARD

(75) Inventors: Mark J. Bailey, Lake City, MN (US); Michael John Shea, Rochester, MN (US); Gerald Wayne Swift, Rolling Hills Estates, CA (US)

(73) Assignee: International Business Machines Corporation, Armonk, NY (US)

( * ) Notice: Subject to any disclaimer, the term of this patent is extended or adjusted under 35 U.S.C. 154(b) by 25 days.

(21) Appl. No.: 09/953,934

(22) Filed: Sep. 18, 2001

(65) Prior Publication Data

US 2002/0023776 A1 Feb. 28, 2002

Related U.S. Application Data

(62) Division of application No. 09/651,334, filed on Aug. 31, 2000.

(51) Int. Cl.[7] .................................................. H05K 3/10
(52) U.S. Cl. ......................... 29/846; 29/825; 29/852; 174/254; 174/255; 427/97
(58) Field of Search ....................... 29/825, 852, 846; 427/97; 174/254, 255

(56) References Cited

U.S. PATENT DOCUMENTS

| | | | | |
|---|---|---|---|---|
| 5,567,329 A | * | 10/1996 | Rose et al. |
| 5,935,763 A | * | 8/1999 | Caterer et al. |
| 5,948,280 A | * | 9/1999 | Namgung |
| 6,112,408 A | * | 9/2000 | Haze et al. |
| 6,181,569 B1 | * | 1/2001 | Chakravorty |
| 6,487,083 B1 | * | 11/2002 | Kwong |

* cited by examiner

Primary Examiner—Carl J. Arbes
(74) Attorney, Agent, or Firm—Robert H. Berdo, Jr.; Rabin & Berdo, PC (57) ABSTRACT

A surface laminar circuit board includes an insulating layer, and a signal ground conductive layer disposed on an upper surface of the insulating layer. The conductive layer has a hole formed therein. A photosensitive dielectric layer is disposed on an upper surface of the signal ground conductive layer. The dielectric layer has a photo micro-via formed therein. A signal trace is disposed on the photosensitive dielectric layer, and is electrically coupled with the signal ground conductive layer by way of the photo micro-via. A conductive pad is provided, which has a majority thereof within an area defined by an outer periphery of the hole. The conductive pad is electrically coupled with the signal trace. A surface mounted component is mounted on the conductive pad.

11 Claims, 9 Drawing Sheets

METHOD OF MAKING SURFACE LAMINAR CIRCUIT BOARD

This is a Divisional of prior application Ser. No. 09/651,334, filed on Aug. 31, 2000

BACKGROUND OF THE INVENTION

1. Field of the Invention

The present invention relates to an enhanced surface laminar circuit board, and in particular, to a surface laminar circuit board in which a conductive layer of the surface laminar circuit board is removed in a region beneath a conductive pad.

2. Background Information

A printed circuit board (also known as a printed wiring board) is typically a flat board having a front surface that has various electronic components, such as integrated circuit chips, attached thereto and having electrically conductive pathways or wirings (also known as traces) between the components, which are printed on the back and/or front surface of the board.

The conventional printed circuit board is further typically formed of a plurality of superposed, laminated and alternating layers of conductive and insulating materials. The layers are each formed in discrete planes. For example, the conductive layers of a typical printed circuit board may include one or more internal wiring planes (i. e., a set of wirings located in one plane), each of which includes a number of individual conductive wirings. As mentioned above, the wirings are used to interconnect the various electronic components locatable on the printed circuit board together, and allow the transmission of electrical signals.

Further, the conductive layers of the printed circuit board may also include one or more power planes and/or ground planes, which are typically sheets of conductive material, such as copper. The power planes are used to supply power from the printed circuit board to the various electronic components located on the printed circuit board, whereas the ground planes serve as a ground potential for the various electronic components. The power planes and the ground planes may be located in different planes from the wiring planes, or may be located in the same plane as a respective wiring plane.

Each of the conductive layers of the printed circuit board are separated from the other overlying and/or underlying conductive layers by a respective layer of insulating material. Moreover, typically the printed circuit board will be provided with a number of plated mechanically-formed through holes and/or a number of plated mechanically-formed vias (i. e., blind holes formed in the insulating layers and plated or filled with a conductive material). Each plated via and plated through hole is electrically coupled to a respective conductive layer, and is used to transmit power or electrical signals, through respective insulating layers, to and from the associated electrical components and/or between the respective conductive layers.

In general, the electronic components can be attached to the surface of the printed circuit board in two different manners. If the electronic components are of the type known as a pin-through-hole part, the board will be provided with a plurality of holes therethrough. The pin-through-hole part has legs (pins) which fit through the holes, and are soldered, for example, to secure the component to the board. Alternatively, the parts may be attached to the board using surface mount technology (SMT). With this technology, the board, which may also include pin-through-hole-parts, is provided with a pad on a top or bottom surface thereof, on which a component lead is placed for securing the component (known as a surface mounted component) to the board. The procedure associated with SMT includes, in general, the use of a screen printer, and one or more component placement machines, for example, a high-speed placer, and a general purpose placement machine. The screen printer applies solder paste to a board, whereas the component placement machine populates the board with various components. After the board is completely populated with components, it is moved through an oven, where the solder paste is reflowed.

The aforementioned conventional printed circuit boards typically are limited in their density due to design constraints. Thus, so-called surface laminar circuit boards have been developed. Surface laminar circuit boards are tailored to accept surface mounted components, and have an increased density over a standard printed circuit board. Surface laminar circuit boards are particularly useful in the areas of data processing, consumer, and telecommunications, where miniaturization is a strong driver.

The surface laminar circuit board builds on the standard printed circuit board to provide a high-density surface layer. The density is achieved by substituting micro photo-vias for plated through holes and mechanically formed vias, with a two- to three-times reduction in land diameter.

The manufacturing process of the surface laminar circuit board begins with a standard printed circuit board, i. e., a circuit board that includes a plurality of conductive layers separated by an insulating layer, such as an industry standard FR4 insulating layer. Typically, the standard printed circuit board will have a conductive layer, which will serve at least as a signal ground layer (i.e., a ground plane), on its upper surface. A liquid or film photosensitive dielectric material is applied over the upper surface, that is, in contact with the underlying signal ground layer. The photosensitive dielectric material is then patterned through exposure and development of the dielectric material to form micro photo-vias to the conductive signal ground layer directly below. Through holes may then be drilled, followed by a plating and etch process or pattern plate process to form the circuitry (i.e., the pads and the signal traces of the surface laminar circuit board), with the dielectric layer separating the circuitry from the underlying signal ground layer.

This process can provide large numbers of small blind micro vias economically, consuming far less real estate than normal plated through holes and mechanically-formed vias. With blind micro photo-vias, real estate is consumed only on one side of the printed circuit board, whereas a plated through hole consumes real estate on all layers of the printed circuit board, even though the desired interconnection may be only from the top layer of the printed circuit board to the layer below. Further, the blind micro photo-vias of the surface laminar circuit board are smaller than mechanically-formed blind vias or plated through holes.

However, the known surface laminar circuit board has a high parasitic capacitance of the pads used to mount the surface mounted components. This is because the dielectric layer, which separates the signal ground layer from the pads and the signal traces (which are electrically coupled to the pads) is relatively thin. This places the signal ground layer very close to the signal traces (i.e., currently about 40 micrometers). This closeness causes the pads to have a higher capacitance to ground (i.e., parasitic capacitance)

than with a standard printed circuit board, in which the signal traces and pads have a larger separation to the signal ground layer (i.e., the thickness of the insulating layer, which is about 100 micrometers or greater). This unwanted parasitic capacitance undesirably reduces frequency response. Therefore, there is need for a surface laminar circuit board mounting arrangement in which parasitic capacitance of the pad is reduced.

Moreover, the dielectric layer, which separates the signal ground layer from the signal traces and pads, does not bond as well to copper as it does to an insulating layer, such as the FR-4 insulating layer. However, the signal ground layer is typically a solid sheet of copper, and conventionally separates the underlying insulating layer from the overlying dielectric layer, so that the dielectric layer is formed on the signal ground layer. Typically, to increase the bonding strength of the dielectric layer to the copper signal ground layer, the signal ground layer is provided with a number of small holes. This allows a portion of the dielectric layer to bond directly to the insulating layer via the holes in the signal ground layer. However, this approach does not provide sufficient contact area between the dielectric layer and the signal ground layer to provide a suitable bond, especially in a region of the pads. Thus, the bond between the dielectric layer of the conventional surface laminar circuit board and the signal ground layer is relatively weak, resulting in a weak bond strength of the pad to the circuit board.

Therefore, there is need for a surface laminar circuit board mounting arrangement having an increased bond strength of the pad.

SUMMARY OF THE INVENTION

It is, therefore, a principle object of this invention to provide an enhanced surface laminar circuit board.

It is another object of the invention to provide an enhanced surface laminar circuit board that solves the above mentioned problems.

These and other objects of the present invention are accomplished by the enhanced surface laminar circuit board disclosed herein.

According to one aspect of the invention, and in order to reduce parasitic capacitance between a yet-to-be formed conductive pad and the underlying signal ground layer, and to improve the bonding strength of a yet-to-be deposited dielectric layer, a portion of the signal ground layer is removed, so as to form a hole in the signal ground layer. This hole is positioned so as to be in registration with the yet-to-be formed conductive pad, and is sized so that a major portion (over 50%, and preferably about 100%) of the conductive pad will be located in an area defined by the hole (i. e., either directly over or within the hole). Moreover, the hole exposes a substantial portion of the underlying insulating layer, which would conventionally be covered by the signal ground layer.

After the hole is formed in the signal ground layer, a liquid or film photosensitive dielectric layer is applied over the signal ground layer, so as to fill the hole.

In an exemplary aspect of the invention, the hole formed within the signal ground layer is larger than the surface area of the yet-to-be formed conductive pad. As such, the dielectric layer, which exhibits a poor bonding strength with copper, but good bonding capabilities to a conventional insulating material, will be in direct contact with, and positively bonded to the underlying insulating layer in a region of the hole. Thus, the dielectric layer is not as likely to delaminate as with the conventional arrangements. Therefore, this arrangement advantageously increases the bond of the dielectric layer to the underlying printed circuit board, especially in a region of the yet-to-be formed conductive pad.

In a further exemplary aspect the invention, the photosensitive dielectric layer is patterned to remove a portion of the dielectric layer, in a region of the hole, prior to forming the pads. As such, the pads can then be formed directly on the uppermost insulating layer. Since the conductive pads typically bond better to a conventional printed circuit board insulating material than to a photosensitive dielectric material, this arrangement advantageously further increases the bonding strength of the pads.

By removing the signal ground layer from directly under the pads, the cause of the high parasitic capacitance in the conventional surface laminar circuit board is eliminated. As such, a surface mounted component utilized with the present invention will have an increased frequency response.

Moreover, since the dielectric layer is bonded directly to the underlying insulating layer over a relatively large area, the bonding strength of the dielectric layer is increased, reducing the risk of delamination of the surface laminar circuit board, especially in a region of the pad.

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Further, in the application, the terms "upper", "lower", "front", "back", "over", "under", and similar such terms are not to be construed as limiting the invention to a particular orientation. Instead, these terms are used only on a relative basis.

The present invention improves upon a conventional surface laminar circuit board. The details of the conventional surface laminar circuit board are well known to those skilled in the art, and will only be briefly discussed in the paragraphs that follow. However, the following description of the conventional surface laminar circuit board is only exemplary. Thus, aspects of the current invention which utilize features of the conventional surface laminar circuit board, and the methods of making the same, may be modified without departing from the spirit and scope of the invention.

Figure 1:
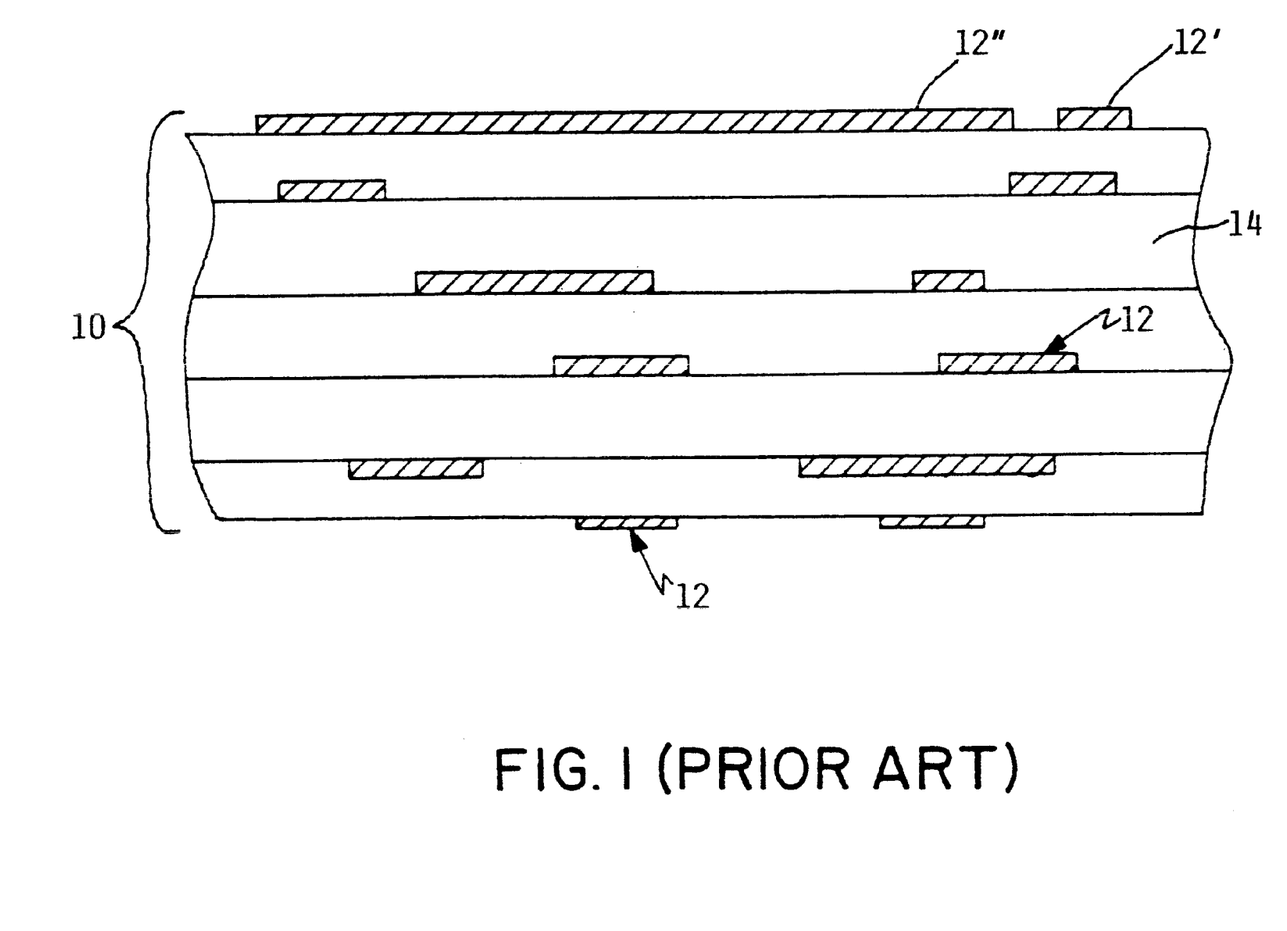
FIG. 1 is a sectional view of a conventional printed circuit board, having a signal ground layer on its upper surface.

Referring in particular to FIG. 1, the surface laminar circuit board according to the present invention utilizes a conventional laminated printed circuit board 10, which is typically formed of a plurality of superposed, laminated and alternating layers of conductive and insulative materials. In the exemplary embodiment, the conductive layers 12 of the printed circuit board 10 are separated from overlying and/or underlying conductive layers by a respective layer of insulating material 14. For example, such an insulating layer may be an industry standard FR4 insulating layer, comprised of fiberglass epoxy material. Of course, other types of insulating layers may be utilized without departing from the spirit and scope of the invention.

Moreover, the conductive layers 12 include one or more wiring signal traces 12', for interconnecting various electronic components locatable on the printed circuit board 10 together, and allowing the transmission of electrical signals. Further, the conductive layers 12 of the exemplary printed circuit board also include at least a signal ground layer 12", which serves as a ground potential for the various electronic components to be populated on the board, and which is typically a sheet of conductive material, such as copper. As shown, the signal ground layer 12" is disposed on an outer surface of the conventional printed circuit board 10. Moreover, as is typical, the signal ground layer 12" is disposed in the same plane as one of the wiring signal traces 12', although it may also be located in a different plane from the wiring signal traces.

As will be appreciated, the arrangement and configuration of the various conductive layers 12 and insulating layers 14 is for explanatory purposes only. For example, there may be more or fewer of the respective layers 12, 14 than are shown. Moreover, the signal ground layer 12" and wiring signal traces 12' may be tailored in an infinite number of different configurations, without departing from the spirit of the invention.

Figure 2:
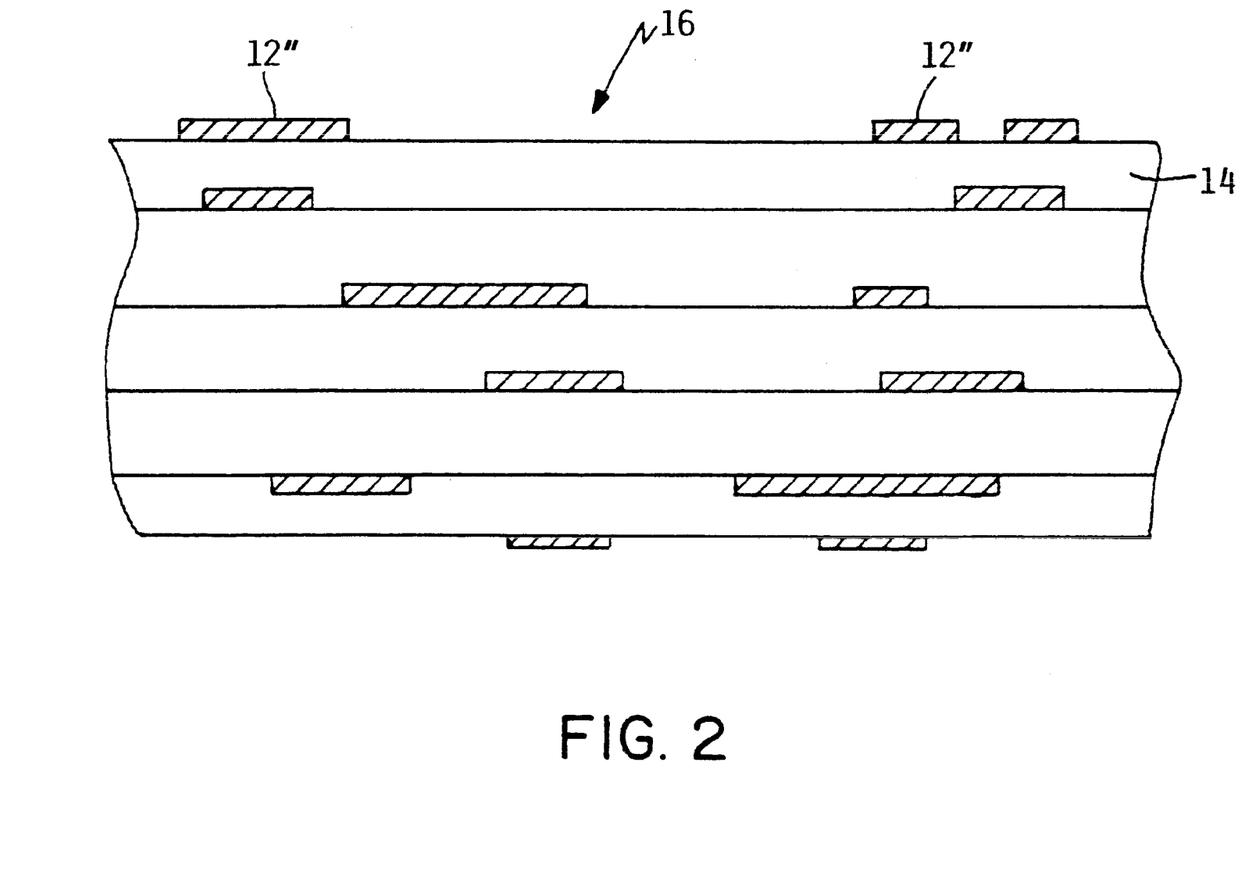
FIG. 2 is a sectional view of the printed circuit board shown in FIG. 1, after a portion of the signal ground layer has been removed to form a hole therein, in accordance with the present invention.

Conventionally, the signal ground layer 12" is disposed directly under the yet-to-be formed conductive pad, and separated therefrom using a yet-to-be formed dielectric layer. Referring to FIG. 2, in order to reduce parasitic capacitance between the yet-to-be formed conductive pad and the underlying signal ground layer 12", and to improve the bonding strength of the yet-to-be deposited dielectric layer and conductive pad, a portion of the signal ground layer 12" is removed, so as to form a hole 16 in the signal ground layer. This hole 16 is positioned so as to be in registration with the yet-to-be formed conductive pad, and is sized so that a major portion (over 50%, and preferably about 100%) of the conductive pad will be located in an area defined by the hole (i.e., either directly on or in the hole). Moreover, the hole 16 exposes a substantial portion of the underlying insulating layer 14, which would conventionally be covered by the signal ground layer.

The hole 16 of the signal ground layer 12" can be formed in any conventional manner, and can have any desired shape. For example, the signal ground layer 12" can be etched to form the hole 16. Other methods of forming the hole 16 within the signal ground layer 12" are also within the scope of the present invention.

Figure 3:
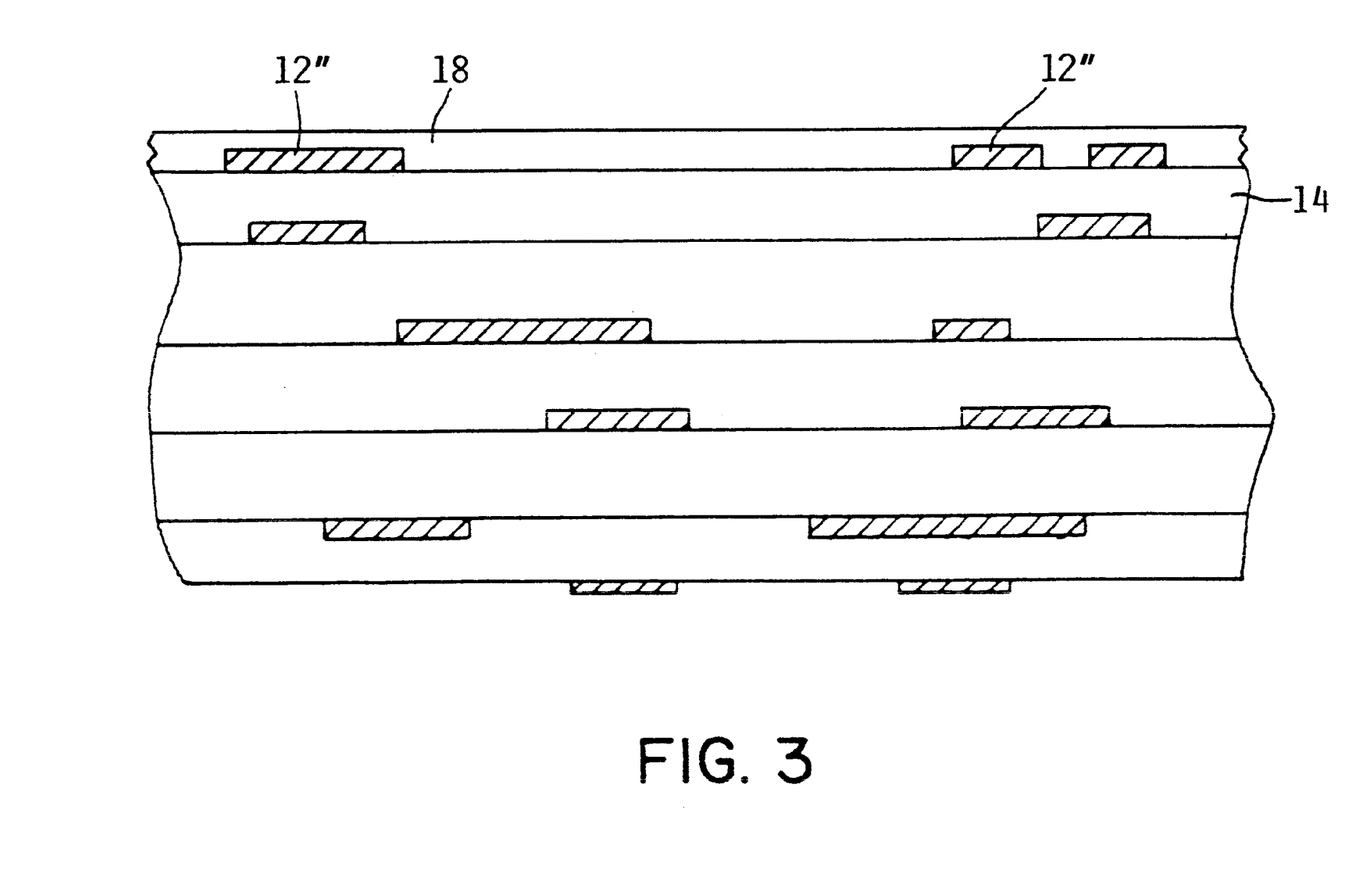
FIG. 3 is a sectional view of the printed circuit board shown in FIG. 2, after the depositing of a photosensitive dielectric layer.

Referring to FIG. 3, after the hole 16 of the signal ground layer 12" is formed, a liquid or film photosensitive dielectric layer 18 is applied over the signal ground layer 12", to a thickness of about 40 micrometers, for example, and so as to fill the hole 16. The dielectric layer 18 is used to separate yet-to-be formed circuitry from the signal ground layer 12" and from any previously exposed wiring signal traces 12'.

In an exemplary aspect of the invention, the hole 16 formed within the signal ground layer 12" is larger than the surface area of the yet-to-be formed conductive pad. As such, the dielectric layer 18, which exhibits a poor bonding strength with copper, but good bonding capabilities to a conventional insulating material, will be in direct contact with, and positively bonded-to the underlying insulating layer 14 over a relatively large area in a region of the hole 16. Thus, the dielectric layer 18 is not as likely to delaminate as with the conventional arrangements. Therefore, this arrangement advantageously increases the bond of the dielectric layer 18 to the underlying printed circuit board 10, especially in a region of the yet-to-be formed conductive pad.

Figure 4:
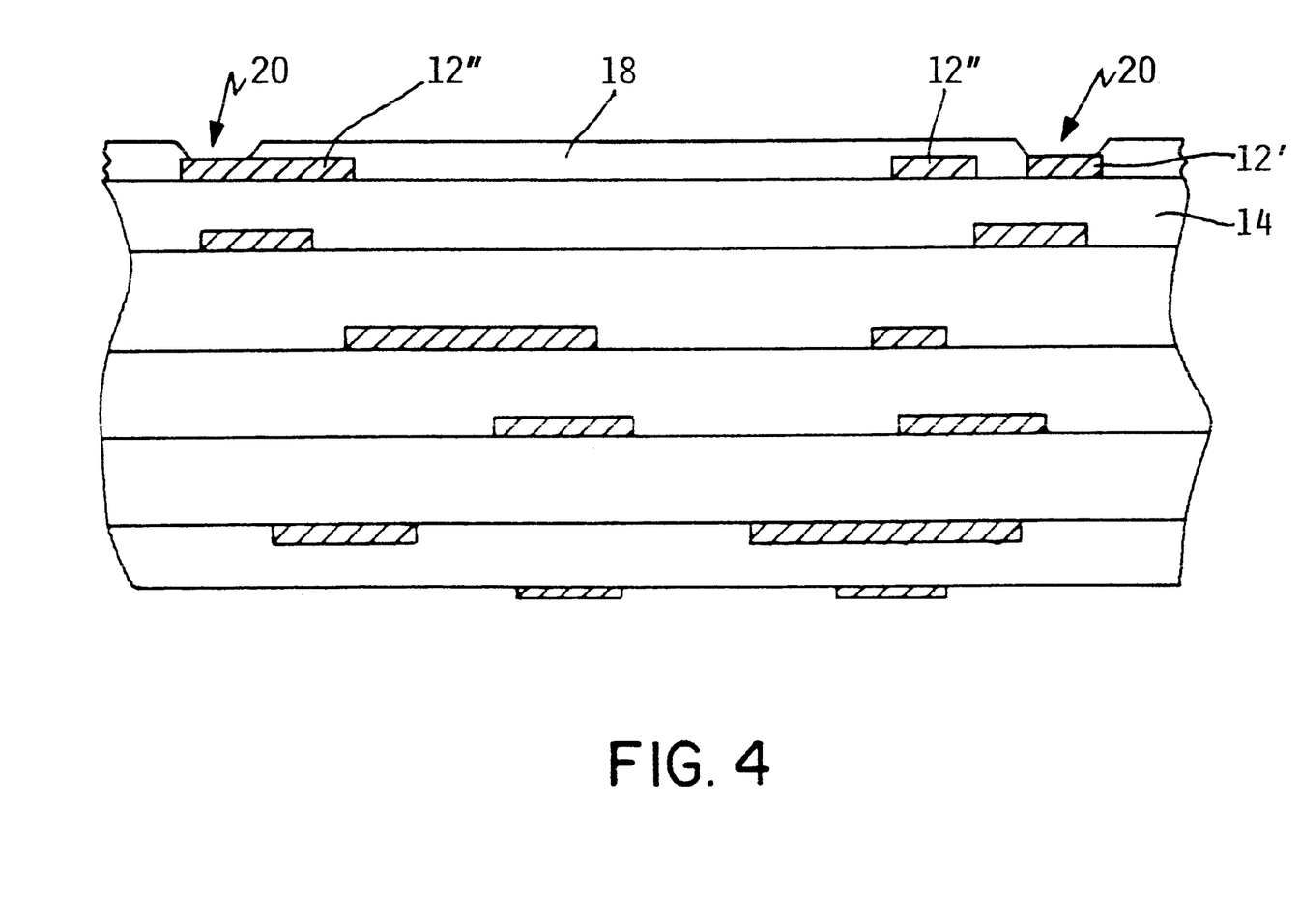
FIG. 4 is a sectional view of the printed circuit board shown in FIG. 3, after the formation of micro-vias in the photosensitive dielectric layer.

Referring to FIG. 4, the photosensitive dielectric layer 18 is then patterned in a conventional manner. For example, the dielectric layer 18 can be patterned through exposure and development of the dielectric material to form micro photo-vias 20 to the conductive signal ground layer 12" and/or signal traces 12' directly below.

Figure 5:
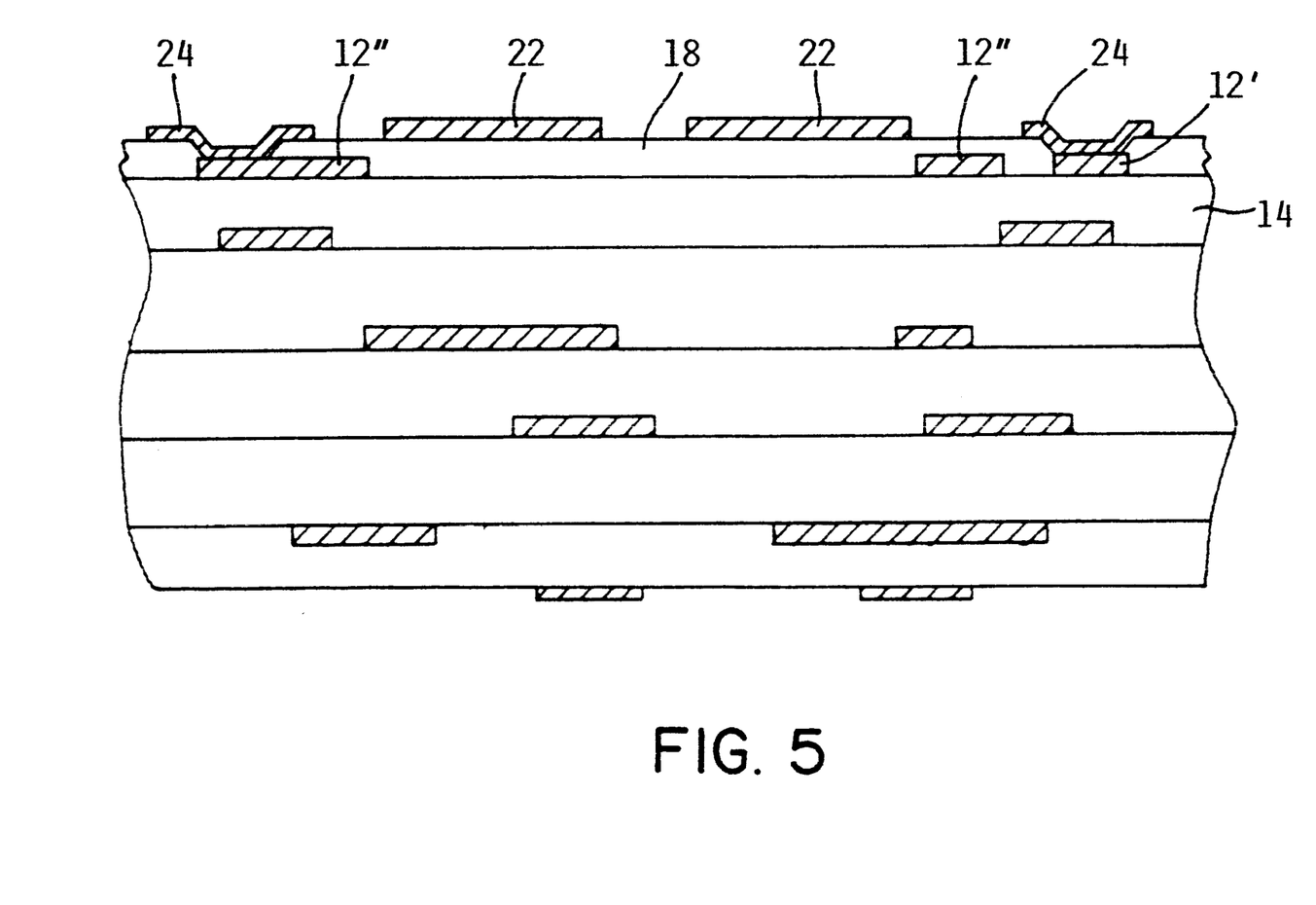
FIG. 5 is a sectional view of the printed circuit board shown in FIG. 4, after the formation of surface laminar circuitry, thus forming a surface laminar circuit board.

Referring to FIG. 5, through holes (not shown) may then be drilled through the circuit board, followed by a plating and etch process or pattern plate process, for example, to form the circuitry, i.e., the pads 22 and the signal traces 24 of the surface laminar circuit board. As shown, the dielectric layer 18 separates the pads 22 from the underlying signal ground layer 12", and from the underlying insulating layer 14. Moreover, although not shown, it will be appreciated that the forming of the circuitry typically includes forming signal traces that are coupled to the pads 22, and which couple the pads to underlying circuitry, such as the wiring signal trace 12', by way of micro photo-vias 20.

Figure 6:
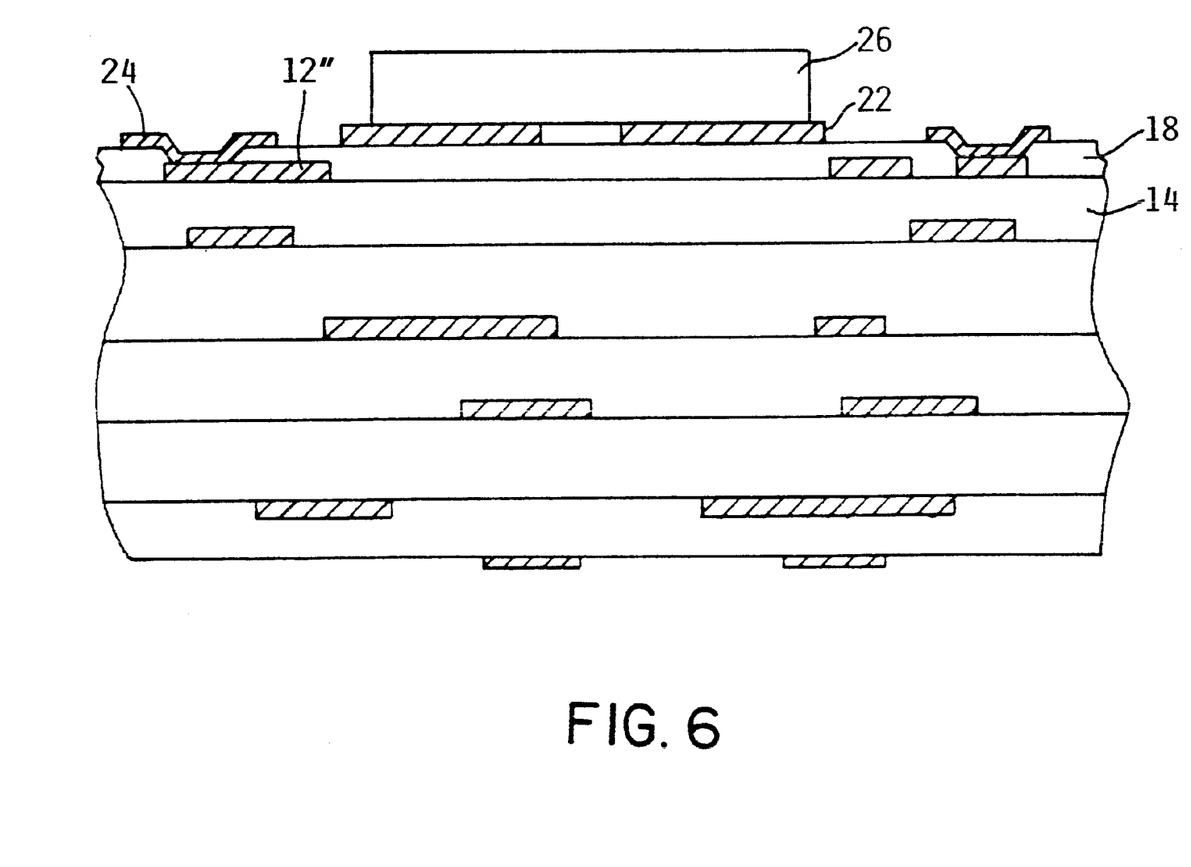
FIG. 6 is a sectional view of the surface laminar circuit board shown in FIG. 5, after the attachment of a surface mounted component.

As shown in FIG. 6, a surface mounted electronic component 26 is then attached to the pads 22, in a conventional manner.

Figure 7:
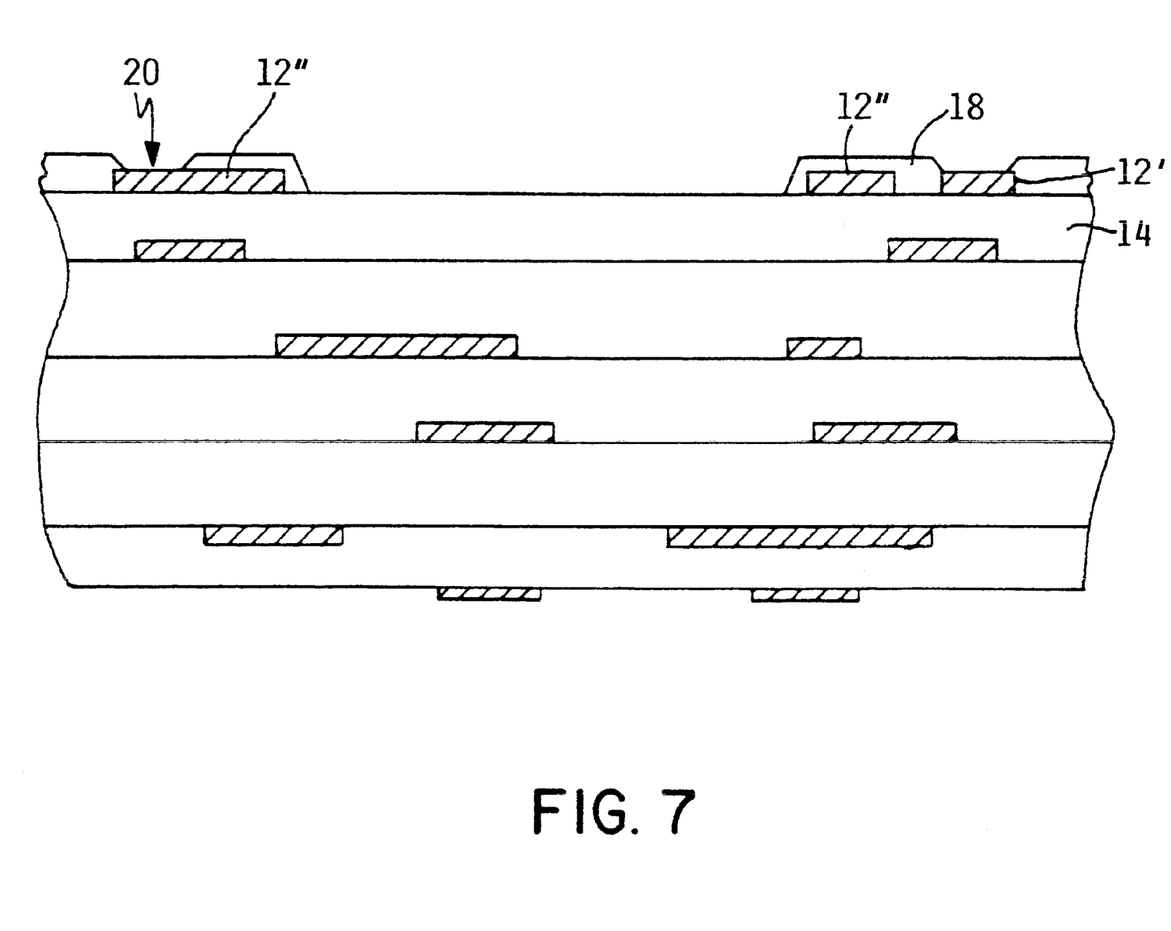
FIG. 7 is a sectional view of a further aspect of the invention, after the formation of micro-vias in the photosensitive dielectric layer, and removal of the dielectric layer in a region of the hole.
Figure 8:
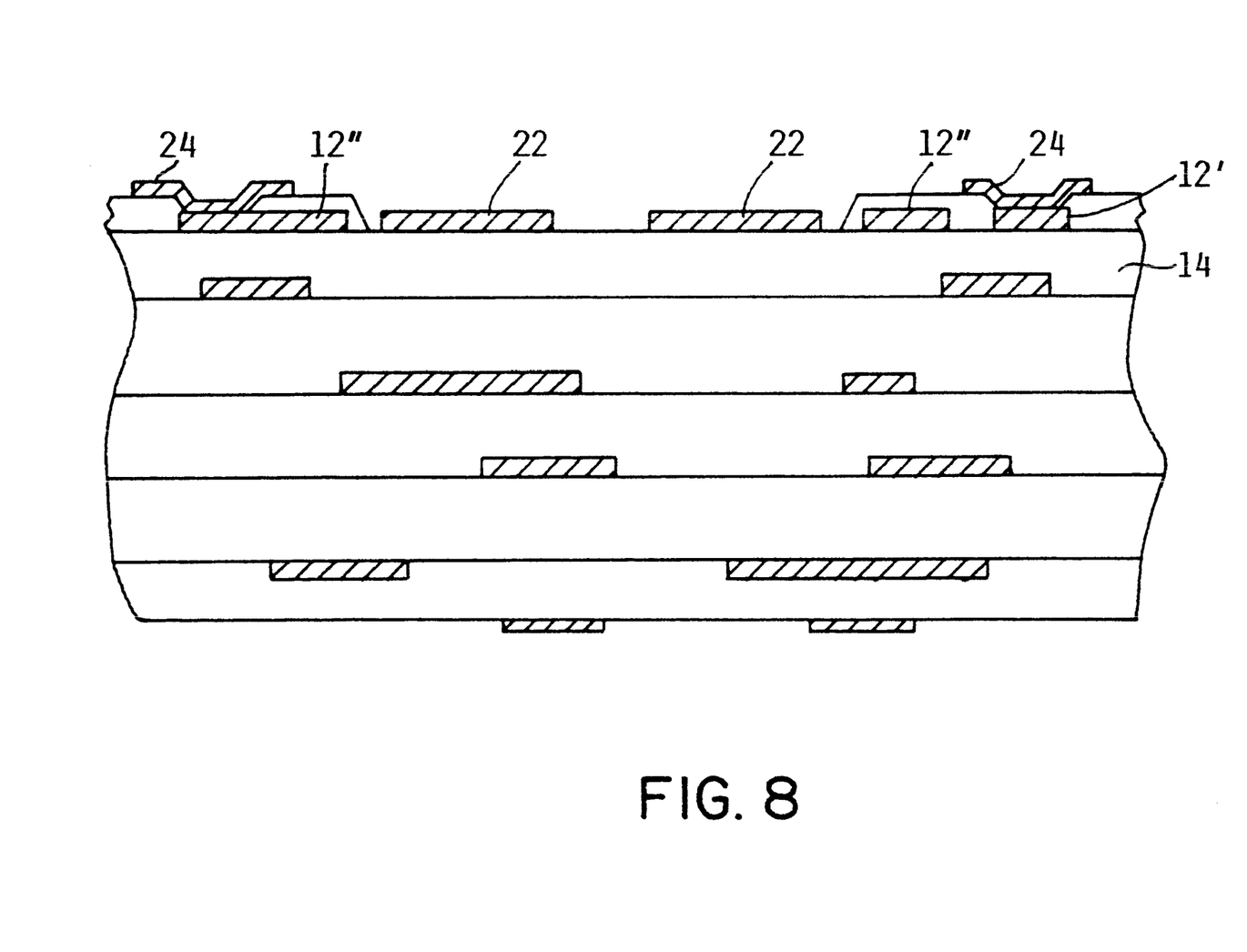
FIG. 8 is a sectional view of the printed circuit board shown in FIG. 7, after the formation of surface laminar circuitry, thus forming a surface laminar circuit board.

Referring to FIG. 7, a further exemplary aspect the invention is illustrated. This aspect is identical to the previous exemplary embodiment, through the first three Figures. However, this exemplary embodiment includes patterning the photosensitive dielectric layer 18 to form micro photo-vias 20 to the conductive signal ground layer 12" and/or signal traces 12' directly below, and to remove the portion of the dielectric layer 18, in a region of the hole 16, prior to forming the pads 22. As such, as shown in FIG. 8, the pads 22 can then be formed directly on the uppermost insulating layer 14. Since the conductive pads typically bond better to a conventional printed circuit board insulating material than to a photosensitive dielectric material, this arrangement would further increase the bonding strength of the pads.

Figure 9:
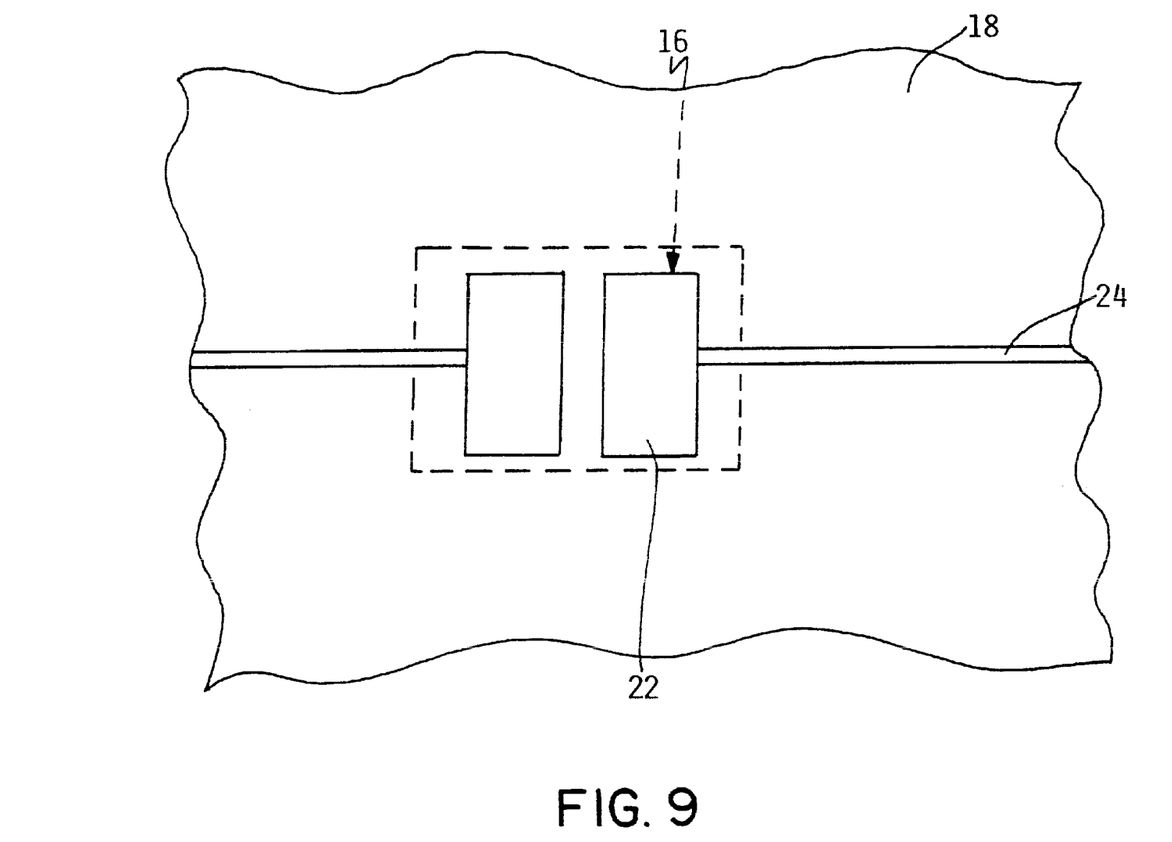
FIG. 9 is a top-down view of the printed circuit board according to the present invention.

FIG. 9 is a top-down view of an exemplary aspect of the invention, illustrating the positioning of the pads 16. As shown, the hole 16 has a rectangular shape. However, the hole 16 may have other shapes without departing from the invention.

By removing the signal ground layer 12" from directly under the pads 22, the cause of the high parasitic capacitance in the conventional surface laminar circuit board is eliminated. As such, a surface mounted component 26 utilized with the present invention will have an increased frequency response.

Moreover, as described in the first exemplary aspect of the invention, since the dielectric layer 18 can be bonded directly to the underlying insulating layer 14 over a relatively large area, the bonding strength of the dielectric layer is increased, reducing the risk of delamination of the surface laminar circuit board, especially in a region of the pads 22.

It should be understood, however, that the invention is not necessarily limited to the specific arrangement and components shown and described above, but may be susceptible to numerous variations within the scope of the invention. For example, the exemplary photosensitive dielectric layer, and the associated surface laminar circuitry, could be formed on both outer surfaces of the printed circuit board. Moreover, additional layers could be subsequently formed over the photosensitive dielectric layer, and the associated surface laminar circuitry, without departing from the spirit and scope of the invention.

It will be apparent to one skilled in the art that the manner of making and using the claimed invention has been adequately disclosed in the above-written description of the preferred embodiments taken together with the drawings.

It will be understood that the above description of the preferred embodiments of the present invention are susceptible to various modifications, changes, and adaptations, and the same are intended to be comprehended within the meaning and range of equivalents of the appended claims.

What is claimed is:

1. A method of making a surface laminar circuit board, comprising:
   providing a laminated printed circuit board having an insulating layer, and a conductive layer over the insulating layer;
   patterning the conductive layer to form a hole therein, and to expose a portion of the insulating layer by way of the hole;
   applying a dielectric layer over the patterned conductive layer and in direct contact with the exposed portion of the insulating layer;
   forming a conductive pad with a majority thereof being disposed within an area defined by an outer periphery of the hole; and
   attaching a surface mounted component to the conductive pad.

2. The method of claim 1, wherein said forming a conductive pad forms the conductive pad on the dielectric layer, with a majority of the conductive pad being formed directly over the hole.

3. The method of claim 1, wherein said forming a conductive pad forms the conductive pad on the insulating layer, and within the hole.

4. The method of claim 1, wherein the dielectric layer is a photosensitive dielectric layer; further comprising exposing and developing the photosensitive dielectric layer to form a micro photo-via in the photosensitive dielectric layer.

5. The method of claim 4, further comprising forming a signal trace on the photosensitive dielectric layer and in electrical communication with the conductive layer by way of the micro photo-via.

6. The method of claim 4, wherein said exposing and developing removes at least a portion of the photosensitive dielectric layer from within the hole; and wherein said forming a conductive pad forms the conductive pad on the insulating layer, and within the hole.

7. A method of making a surface laminar circuit board, comprising:
   providing a laminated printed circuit board having an insulating layer, and a conductive layer directly on the insulating layer;
   patterning the conductive layer to form a hole therein, and to expose a portion of the insulating layer by way of the hole;
   applying a dielectric layer on the patterned conductive layer, and within the hole so that the dielectric layer at least partially fills the hole and is in direct contact with the exposed portion of the insulating layer at a base of the hole; and
   forming a conductive pad, that is adapted to receive a surface mounted component thereon, directly on the dielectric layer, with essentially all of said conductive pad being disposed over the at least partially filled hole, so that an area under essentially all of said conductive pad is free of the conductive layer.

8. The method of making a surface laminar circuit board as recited in claim 7, wherein the conductive layer is adapted to serve as a ground potential.

9. A method of making a surface laminar circuit board, comprising:
   providing a laminated printed circuit board having an insulating layer, and a conductive layer directly on the insulating layer;
   patterning the conductive layer to form a hole therein, and to expose a portion of the insulating layer by way of the hole;
   applying a dielectric layer on the patterned conductive layer; and
   forming a conductive pad, that is adapted to receive a surface mounted component thereon, within the hole and directly on the exposed portion of the insulating layer at a base of the hole, so that an area under essentially all of said conductive pad is free of the conductive layer.

10. The method of making a surface laminar circuit board as recited in claim 9, wherein said applying a dielectric layer includes applying the dielectric layer within the hole; further comprising patterning the dielectric layer to remove the dielectric layer from within the hole prior to said forming a conductive pad.

11. The method of making a surface laminar circuit board as recited in claim 9, wherein the conductive layer is adapted to serve as a ground potential.

* * * * *